(12) United States Patent
Ullrich et al.

(10) Patent No.: US 6,777,914 B2
(45) Date of Patent: Aug. 17, 2004

(54) METHOD FOR DETERMINING THE STATE OF CHARGE OF RECHARGEABLE BATTERIES BY INTEGRATION OF THE AMOUNTS OF CURRENT FLOWING DURING CHARGING AND DISCHARGING

(75) Inventors: Matthias Ullrich, Gifhorn (DE); Hans-Walter Folge, Peine (DE); Claus Schmitz, Ludinghausen (DE)

(73) Assignee: Varta Automotive Systems GmbH (DE)

( * ) Notice: Subject to any disclaimer, the term of this patent is extended or adjusted under 35 U.S.C. 154(b) by 0 days.

(21) Appl. No.: 10/278,185

(22) Filed: Oct. 21, 2002

(65) Prior Publication Data

US 2003/0085688 A1 May 8, 2003

(30) Foreign Application Priority Data

Nov. 2, 2001 (DE) .......................................... 101 53 916

(51) Int. Cl.[7] .......................... H02J 7/00; G01N 27/416
(52) U.S. Cl. ...................................... 320/132; 324/429
(58) Field of Search ................................. 324/426–434; 320/132, 134, 149

(56) References Cited

U.S. PATENT DOCUMENTS

| | | | | | |
|---|---|---|---|---|---|
| 3,906,329 A | * | 9/1975 | Bader | ........................ | 320/134 |
| 4,012,681 A | * | 3/1977 | Finger et al. | ............... | 324/428 |
| 4,153,867 A | * | 5/1979 | Jungfer et al. | .............. | 324/436 |
| 5,698,965 A | * | 12/1997 | York | .......................... | 320/132 |
| 5,744,936 A | * | 4/1998 | Kawakami | .................. | 320/120 |
| 6,392,414 B2 | * | 5/2002 | Bertness | ..................... | 324/429 |
| 6,441,585 B1 | * | 8/2002 | Bertness | ..................... | 320/132 |
| 6,495,990 B2 | * | 12/2002 | Champlin | ................... | 320/132 |
| 6,600,293 B2 | * | 7/2003 | Kikuchi | ..................... | 320/131 |

FOREIGN PATENT DOCUMENTS

| | | |
|---|---|---|
| DE | 22 42 510 | 6/1976 |
| DE | 40 07 883 A1 | 9/1991 |

* cited by examiner

*Primary Examiner*—Pia Tibbits
(74) *Attorney, Agent, or Firm*—Foley & Lardner LLP

(57) ABSTRACT

In a method for determining the state of charge of rechargeable batteries by integration of the amounts of current flowing during charging and discharging, a first state of charge value $LZ_A$ is determined by continuous integration of the rechargeable battery current. A second state of charge value $LZ_B$ is determined by measurement of the no-load voltage $U_0$ after receiving or supplying a defined amount of charge Q which is sufficient in order to leave the region of the mixed potential of the electrodes and to reach a no-load voltage of the rechargeable battery, and by comparison of this measured no-load voltage $U_0$ with empirically determined no-load voltage characteristics for the rechargeable battery. From the state of charge values obtained in this way, that state of charge value is chosen which is more reliable in the preceding operating conditions, with the assessment of $LZ_A$ taking into account in particular the charge throughput in the assessment of $LZ_B$, in particular the amount of charge Q which has flowed. The amount of charge Q should be at least 1 to 40%, preferably 5 to 50%, of the rated capacity of the rechargeable battery.

9 Claims, 1 Drawing Sheet

STATE OF CHARGE VALUE

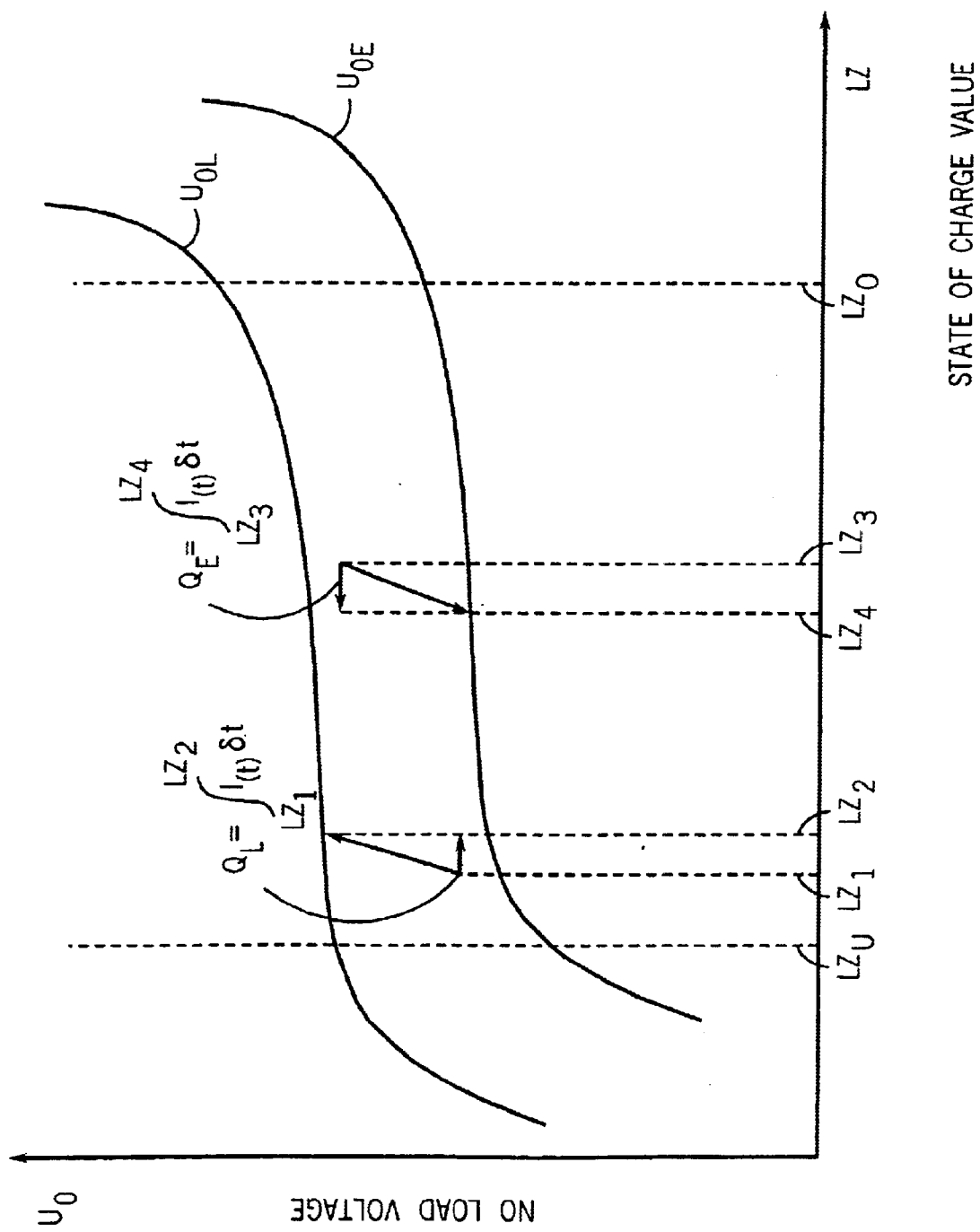

METHOD FOR DETERMINING THE STATE OF CHARGE OF RECHARGEABLE BATTERIES BY INTEGRATION OF THE AMOUNTS OF CURRENT FLOWING DURING CHARGING AND DISCHARGING

RELATED APPLICATION

This patent application claims the benefit of German Patent Application No. DE 101 53 916.9, filed Nov. 2, 2001.

FIELD OF THE INVENTION

This invention relates to a method for determining the state of charge of rechargeable batteries by integration of the amounts of current flowing during charging and discharging.

BACKGROUND

The present state of charge has to be determined for numerous applications of rechargeable batteries. The primary measurement variables for this purpose are rechargeable battery current, rechargeable battery voltage and temperature. Known methods for determining the state of charge use, in particular, integration of the current flowing through the rechargeable battery.

DE-C 22 42 510 discloses, for example, weighting the charging current with a factor dependent on the temperature and on the state of charge of the battery itself, in a method for measuring the state of charge. Other cases make use of a comparison of the battery voltage and a known no-load voltage characteristic which describes a unique relationship between the state of charge and the no-load voltage. For example, DE-A 40 07 883 discloses a method in which the starting capability of a rechargeable battery is determined by measuring the rechargeable battery voltage and the battery temperature, and by comparison with a state of charge family of characteristics that is applicable to the battery type to be tested.

These known methods have major disadvantages. For charge balancing, inaccuracies in the current measurement lead to an error which accumulates over time, and which can quickly lead to significant corruption of the results. Furthermore, the self-discharge which occurs from the rechargeable battery during such current integration is not taken into account. The methods which operate using characteristics have disadvantages especially in the case of very flat voltage/state of charge characteristics, since, in this case, very accurate voltage measurement is required and, in general, other factors must additionally be taken into account, such as the magnitude of the rechargeable battery current and the temperature. In the case of systems which do not have a unique voltage/state of charge characteristic, it is impossible to determine the state of charge just from the characteristic on its own. This applies, for example, to a nickel metal hydride system.

The disadvantages of these known methods for determining the state of charge occur more clearly the more dynamic the performance requirement and the smaller the capacity of the rechargeable battery. This is particularly true in battery applications such as a vehicle power supply system battery or hybrid battery in motor vehicles.

It would therefore be advantageous to provide a method for determining the state of charge of a rechargeable battery, in particular of a nickel metal hydride rechargeable battery, which is accurate and provides a reliable prediction of the state of charge even in dynamic applications.

SUMMARY OF THE INVENTION

This invention relates to a method for determining the state of charge of a rechargeable battery by integration of amounts of current flowing during charging and discharging including determining a first state of charge value $LZ_A$ by continuous integration of the rechargeable battery current, determining a second state of charge value $LZ_B$ by measuring a no-load voltage $U_0$ after receiving or supplying a selected amount of charge Q sufficient to leave a region of mixed potential of electrodes of the battery and to reach a no-load voltage of the rechargeable battery and by comparing the measured no-load voltage $U_0$ with empirically determined no-load voltage characteristics for the rechargeable battery, assessing reliability of $LZ_A$ based on charge throughput in the battery, assessing reliability of $LZ_B$ based on the amount of charge Q which has flowed through the battery, wherein the amount of charge Q is between about 1 and about 40% of the rated capacity of the rechargeable battery, and selecting the state of charge of the battery from the obtained state of charge values based on a highest value of reliability of $LZ_A$ or $LZ_B$.

BRIEF DESCRIPTION OF THE DRAWING

The method according to the invention will be explained in more detail in the following text with reference to the drawing.

The drawing is a graph showing the profile of the no-load voltage of a nickel metal hydride rechargeable battery as a function of the state of charge.

DETAILED DESCRIPTION

Voltage $U_{OL}$ is the measured voltage when no current is flowing through the rechargeable battery, and which is produced after completion of a charging process. Voltage $U_{OE}$ is the measured voltage when no current is flowing through the rechargeable battery and which occurs after completion of a discharge process.

The expression "no current flowing" means that the current is in a range between 0 and $I_{10}$, where $I_{10}$ corresponds to the current which is sufficient to charge a rechargeable battery to its rated capacity in 10 hours. In the region between these two characteristics, the electrodes have a so-called "mixed potential", which is characterized by being a no-load potential rather than an equilibrium potential, with undefined interchange current densities between the individual reactions.

According to the invention, a number of state of charge values LZ are calculated continuously during operation of the battery. A first state of charge $LZ_A$, which is also referred to as a "bookkeeping" state of charge, is determined by integrating the current flowing through the rechargeable battery over time. The value determined by this current integration can be improved by corrections. For example, the measured rechargeable battery current can be weighted by a factor η, which describes a charging efficiency which is itself in turn dependent on the state of charge, temperature and current. As a further correction, the self-discharge of the rechargeable battery, which is dependent on the state of charge and the temperature, is permanently subtracted from the state of charge determined by integration. According to an exemplary embodiment, the reliability of the first state of charge value $LZ_A$ is also assessed based on the time since a most recent calibration.

In addition, a further state of charge $LZ_B$ is determined from a correlation of no-load voltage characteristics. The no-load voltage, which occurs either after charging the rechargeable battery with a defined amount of charge Q or after discharging a defined amount of charge Q from the rechargeable battery, is used to determine the second state of charge value. This amount of charge Q must always be sufficient to leave the region of the mixed potential of the electrodes and reach an actual no-load voltage of the rechargeable battery. According to an exemplary embodiment, the amount of charge Q is between about 5 and about 15%. By way of example, the figure shows schematically an amount of charge $Q_L$ ($L_{Z1}L_{Z2}$) and an amount of discharge $Q_E$ ($L_{Z1},L_{Z2}$). As already mentioned above, this no-load voltage can also be measured at current levels which are still within specific limits ($I_{10}$). This no-load voltage can then be corrected by correcting the measured voltage drop from the internal resistance of the battery, with the internal resistance itself being dependent on the state of charge and on temperature. The corrected no-load voltage is then compared with empirically determined no-load voltage characteristics for the rechargeable battery. The state of charge $LZ_B$ is then determined. From the values of the state of charge, that state of charge is chosen, which is more reliable in the preceding operating conditions. In this case, the assessment of $LZ_A$ takes into account the charge throughput for the assessment of $LZ_B$, in particular, the amount of charge Q which has flowed during the measurement.

There is no need for the amount of charge Q to be produced by a continuously flowing charging current. It is also possible, for example, for the charging current to be interrupted by short discharging intervals.

This, thus, results in two possible ways to determine the amount of charge Q. In a first method, the amount of charge Q is determined by time integration of the charging or discharge current of the rechargeable battery. In this method, the value of Q should be within a range from about 1 to about 40% of the rated capacity of the battery, and, in particular, the value Q should be between about 5 and about 10% of the rated capacity of the battery. If the charging or discharging process is interrupted during integration of Q, and the battery is discharged or charged, then the value is reset to 0, and the integration process is carried out once again from the reset value when further charging or discharging takes place.

In a second method, the amount of charge Q can be determined without any need for a current to flow continuously in the charging or discharging direction, and the respective current can be interrupted by short charging or discharging phases. In this case, the rechargeable battery current is integrated over time, with both charging and discharging processes being included in the integration process for determining Q. The amount of charge Q should be between about 1 and about 40%, preferably between about 5 and about 15%, of the rated capacity of the rechargeable battery.

The reliability of the $LZ_B$ values determined from the measured $U_0$ values via the $U_0$/state of charge characteristics depends on various criteria, in particular, on the amount of discharge or charge. The bookkeeping state of charge $LZ_A$, which is determined by current integration, is also subject to an error which becomes larger, especially with time.

In a rechargeable battery which has more than about 20 cells, different voltage elements are measured throughout the battery assembly. The minimum and maximum voltage elements in a rechargeable battery result in $LZ_{Amin}$ and $LZ_{Amax}$ as well as $LZ_{Bmin}$ and $LZ_{Bmax}$ values. These various state of charge values are individually provided with reliability factors. The reliability values are determined and normalized for the various state of charge values using different methods. The reliability value for the bookkeeping state of charge determination process carried out by current integration depends to a very major extent on the time since a last calibration, since all errors in the determination of the current and of the correction factors are integrated over time. Further factors included in the reliability of this state of charge determination method are the amount of charge which has passed through since a recalibration, and the maximum charging or discharge current and, in particular, the battery temperature.

The reliability o the state of charge values determined from the measurement of the no-load voltage is governed by boundary conditions. In particular, it should be remembered that the relationsh between the no-load voltage and the state of charge is more reliable, in certain areas. The state of charge should, thus, be above values of between about 10 and about 30% ($L_{Z0}$) and below values between about 70 and about 90% ($L_{ZU}$). Furthermore, the values of the states of charge determined from voltage elements in the battery should differ only by.ce am amounts, for example with the maximum differences being about 5%. In addition, th absolute value of the current flowing through the battery within a time period is taken i o account. The time period t should be shorter than about 20 minutes, with t being preferably between about 10 seconds and about 3 minutes. The current limit value $I_1$ should be less than C/10 ($I_{10}$), with $I_1$ preferably being between C/100 and C/20. According to an exemplary embodiment, the reliability of $LZ_B$ is based on the state of charge of the rechargeable battery, with states of chargeable between about 70 and about 90% and between about 30 and about 40% indicating higher reliability than other states of charge.

What is claimed is:

1. A method for determining the state of charge of a rechargeable battery by integration of amounts of current flowing during charging and discharging comprising:

determining a first state of charge value $LZ_A$ by continuous integration of the rechargeable battery current;

determining a second state of charge value $LZ_B$ by measuring a voltage $U_0$ under no load after receiving or supplying a selected amount of charge Q sufficient to leave a region of mixed potential of electrodes of the battery and to reach a final no-load voltage of the rechargeable battery and by comparing the measure no-load voltage $U_0$ with empirically determined no-load voltage characteristics for the rechargeable battery;

assessing reliability of $LZ_A$ based on charge throughput in the battery;

assessing reliability of $LZ_B$ based on the amount of charge Q which has flowed through the battery, wherein th amount of charge Q is between about 1 and about 40% of the rated capacity of the rechargeable battery; and selecting the state of charge of the battery from the obtained state of charge values based on a highest value of reliability of $LZ_A$ or $LZ_B$.

2. The method as claimed in claim 1, wherein assessing reliability of $LZ_A$ is also based on the time since a most recent calibration.

3. The method as claimed in claim 1, wherein assessing reliability of $LZ_B$ is based on a magnitude of current flowing during determination of $U_0$, wherein a greater residual current means lower reliability.

4. The method as claimed in claim 2, wherein assessing reliability of $LZ_B$ is based on magnitude of current flowing during determination of $U_0$, wherein a greater residual current means lower reliability.

5. The method as claimed in claim 1, wherein assessing reliability of $LZ_B$ is based on the state of charge of the rechargeable battery, with states of charge between about 70 and about 90% and between about 30 and about 40% indicating higher reliability than other states of charge.

6. The method as claimed in claim 2, wherein assessing reliability of $LZ_B$ is based on the state of charge of the rechargeable battery, with states of charge between about 70 and about 90% and between about 30 and about 40% indicating higher reliability than other states of charge.

7. The method as claimed in claim 3, wherein assessing reliability of $LZ_3$, is based on the state of charge of the rechargeable battery, with states of charge between about 70 and about 90% and between about 30 and about 40% indicating higher reliability than other states of charge.

8. The method as claimed in claim 4, wherein assessing reliability of $LZ_B$ is based on the state of charge of the rechargeable battery, with states of charge between about 70 and about 90% and between about 30 and about 40% indicating higher reliability than other states of charge.

9. The method as claimed in claim 1, wherein the amount of charge Q is between about 5 and about 15%.

\* \* \* \* \*

UNITED STATES PATENT AND TRADEMARK OFFICE
CERTIFICATE OF CORRECTION

PATENT NO.    : 6,777,914 B2
DATED         : August 17, 2004
INVENTOR(S)   : Matthias Ullrich, Hans-Walter Folge and Claus Schmitz It is certified that error appears in the above-identified patent and that said Letters Patent is hereby corrected as shown below:

Column 4,
Line 55, following "wherein" delete "th" and substitute -- the --

Column 6,
Line 2, preceding "is based" delete ","

Signed and Sealed this

Fourteenth Day of December, 2004

JON W. DUDAS
*Director of the United States Patent and Trademark Office*